(12) United States Patent
Ye et al.

(10) Patent No.: US 7,450,396 B2
(45) Date of Patent: Nov. 11, 2008

(54) SKEW COMPENSATION BY CHANGING GROUND PARASITIC FOR TRACES

(75) Inventors: Chunfei Ye, Olympia, WA (US); Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/540,986

(22) Filed: Sep. 28, 2006

(65) Prior Publication Data

US 2008/0080155 A1 Apr. 3, 2008

(51) Int. Cl.
*H05K 7/00* (2006.01)

(52) U.S. Cl. .................. 361/777; 361/792; 174/255; 174/261; 174/262

(58) Field of Classification Search .............. 174/255, 174/261, 262; 361/720, 777, 780, 792; 29/842, 29/874, 882, 852, 846, 25.41, 602.1, 847; 333/1, 4, 12, 28 R, 236
See application file for complete search history.

(56) References Cited

U.S. PATENT DOCUMENTS

| | | | | |
|---|---|---|---|---|
| 4,891,616 | A * | 1/1990 | Renken et al. .............. | 333/236 |
| 5,665,473 | A * | 9/1997 | Okoshi et al. ............... | 428/457 |
| 6,067,053 | A * | 5/2000 | Runyon et al. .............. | 343/797 |
| 6,356,166 | B1 * | 3/2002 | Goldsmith et al. .......... | 333/161 |
| 6,496,886 | B1 * | 12/2002 | Osaka et al. ................ | 710/100 |
| 6,515,458 | B1 * | 2/2003 | Partridge .................... | 323/247 |
| 6,614,325 | B1 * | 9/2003 | Kocin .......................... | 333/12 |
| 6,765,450 | B2 * | 7/2004 | Howard et al. ............... | 333/4 |
| 6,787,710 | B2 * | 9/2004 | Uematsu et al. ............. | 174/261 |
| 6,803,252 | B2 * | 10/2004 | Lao et al. .................... | 438/106 |
| 6,807,734 | B2 * | 10/2004 | Eldridge et al. ............. | 29/874 |
| 7,217,889 | B1 * | 5/2007 | Parameswaran et al. ..... | 174/261 |
| 2003/0091911 | A1 * | 5/2003 | Noelscher ..................... | 430/5 |
| 2003/0179049 | A1 * | 9/2003 | Goergen ........................ | 333/1 |
| 2004/0080938 | A1 * | 4/2004 | Holman et al. .............. | 362/231 |
| 2004/0133375 | A1 * | 7/2004 | Kattan .......................... | 702/89 |
| 2005/0178583 | A1 * | 8/2005 | Lee ............................... | 174/255 |
| 2005/0201065 | A1 * | 9/2005 | Regnier et al. .............. | 361/720 |
| 2006/0065433 | A1 * | 3/2006 | Danoski et al. .............. | 174/255 |
| 2006/0083895 | A1 * | 4/2006 | Ikeda ........................... | 428/137 |
| 2006/0243478 | A1 * | 11/2006 | Inagaki et al. ............... | 174/255 |
| 2006/0244134 | A1 * | 11/2006 | Inagaki et al. ............... | 257/734 |
| 2007/0202747 | A1 * | 8/2007 | Sharf et al. .................. | 439/608 |

* cited by examiner

*Primary Examiner*—Dean A. Reichard
*Assistant Examiner*—Xiaoliang Chen
(74) *Attorney, Agent, or Firm*—Blakely, Sokoloff, Taylor & Zafman LLP

(57) ABSTRACT

According to embodiments, small holes or openings may be cut on or through the ground plane(s) adjacent to a selected trace line, so that C and L will be changed accordingly. Then phase velocity will also be changed. As a result, the flying time from one location or point to a different location or point of the transmission line will also be changed. This concept applies to a single trace. Similarly, this concept may be applied to one trace of a differential pair of traces (e.g., so that the two parts of the differential signal transmitted at one point in time at a location on the pair arrive at the same time at another location of the pair).

5 Claims, 3 Drawing Sheets

SKEW COMPENSATION BY CHANGING GROUND PARASITIC FOR TRACES

FIELD

One or more embodiments relate generally to the field of signal transmission lines or traces. More particularly, one or more embodiments relate to changing a signal phase velocity of a signal transmission on a signal line.

BACKGROUND

Signal lines, conductors, or traces are often used to transmit or send signals between devices or locations of an electronic device, such as a printed circuit board (PCB), semiconductor chip package, or other electronic device or medium. In some cases the speed the signal travels and/or time it takes to go from one location to another, such as over a certain distance, is important. Specifically, in cases of differential signal pairs of signal lines or signal traces, if a signal (e.g., a corresponding point in time of a differential signal) along one of the traces arrives quicker than the signal on the other trace, the difference in time may be defined as a "skew" (e.g., such as where the two traces have different length). Often, due to the layout of traces on an electronic device, rerouting of or complicated design of trace routes is necessary to reduce skew of differential signal pairs, and/or change signal phase velocity for a single trace.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1A:
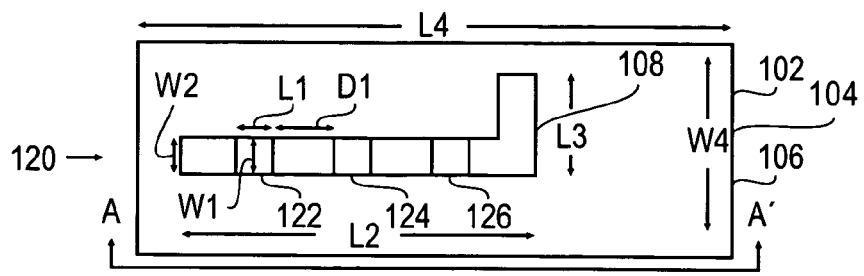
FIG. 1A is a top prospective view of an electronic device having a trace on a dielectric showing openings formed through a ground plane under the trace.

The phase velocity of a signal transmitted in a signal line is determined by or proportional to the square root of the product of the capacitance (C) and the inductance (L) of the transmission line per unit length. For example, harmonic signal propagation in a transmission line may be proportional to the product of C and L (e.g., identified by "(C·L)" or "(CL)") of a line or trace a printed circuit board (PCB), semiconductor chip package, or other electronic device or medium. More specifically, the phase velocity of a signal may be equal to or proportional to $(C \cdot L)^{-1/2}$ as determined by the cross-sectional geometry and the material of: the transmission line: the dielectric or insulator below, under, or adjacent to the transmission line; and/or one or more ground planes below, under, or adjacent the dielectric or insulator. It can be appreciated "the above" and "below" described is arbitrary, as the orientation of the line, dielectric, and plane may be reversed or otherwise oriented. Moreover, more than one dielectric layer and/or ground plane may effect the phase velocity, such as where a trace has multiple ground planes (e.g., ground planes below, above, and/or beside, etc. the trace). Also, in some cases the terms "transmission line", "line" and "trace" may be used interchangeably. Likewise, in some cases the terms "hole" and "opening" may be used interchangeably. Finally, the term "about" may be used to indicate an amount that is within 10, 5, 1, or 0.1 percent of a specified or target amount; or within an unsubstantial amount of the target amount for calculations or functions described herein.

According to embodiments, the harmonic signal propagation, signal speed, signal phase velocity, and/or "flying time" of a signal transmission along a signal line, or signal trace may be changed or adjusted by changes in the capacitance (C) and/or inductance (L) of the line and/or trace and ground. For example, the C (e.g., in Farads) and/or L (e.g., Henries) of an electronic circuit between or including a trace and an adjacent or nearby ground (e.g., an electrically grounded conductor, plane, and/or surface) may be affected, changed, adjusted, or influenced by the shape, thickness, width, length, geometry, material and/or electronic characteristics of the trace and ground, as well as that of insulator, dielectric, conductor, metal, alloy, semiconductor, silicon containing, and/or other materials or layers that are adjacent to, around, above, below, or otherwise have an effect on the C and/or L of the trace and ground.

Thus, according to embodiments, small holes or openings may be cut on or through the ground plane(s) adjacent to a selected trace line, so that C and L will be changed accordingly. Then phase velocity will also be changed. As a result, the flying time from one location or point to a different location or point of the transmission line will also be changed. This concept applies to a single trace, such as a trace that is not carrying or transmitting a differential signal. Similarly, this concept may be applied to one trace (e.g., the longer length trace and/or trace with a faster signal phase velocity) of a differential pair of traces (e.g., so that the two parts of the differential signal transmitted at one point in time at a location on the pair arrive at the same time at another location of the pair).

For instance, for differential signal pairs of traces D+ and D−, where their length is not matched so that D+ and D− will have a skew at receiver end. By cutting small holes on a ground plane adjacent to one trace (D+ or D−), the phase velocity in D+ compared to D− is adjusted, so that even the D+ and D− trace lengths are not matched, the holes can be cut for one of the traces to compensate or manipulate the skew by without the necessity of matching the length of D+ and D− or doing stack up changing. The same concept also applies to any other kind of signals, such as clock signals, that need timing consideration.

Figure 1B:
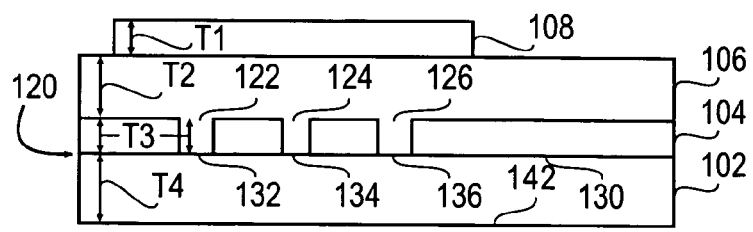
FIG. 1B is a cross-section view of FIG. 1A through line A-A'.

FIG. 1A is a top prospective view of an electronic device having a trace on a dielectric showing openings formed through a ground plane under the trace. FIG. 1B is a cross-section view of FIG. 1A through line A-A'. Layer 108 may define a signal trace, differential signal trace of a pair of differential signal traces, signal line, or trace as known in the art. Trace 108 is formed on or touching insulator layer 106, which is formed on or touching conductive layer 104. Conductive layer 104 is formed on or touching insulator layer 102. Insulator layer 102 has top or upper surface 130 (e.g., disposed towards trace 108) and bottom or lower surface 142 (e.g., disposed away from trace 108). Openings 122, 124, and 126 are formed in or completely through conductive layer 104. Openings 122, 124, and/or 126 may be filled with material from insulator layer 106 and/or from insulator layer 102.

Trace 108 is shown disposed above or over openings 122, 124, and 126 of path of openings 120. In some embodiments, layer 108 may be described as a microstrip trace. Opening 122 is shown having a length L1 and width W1. Also, trace 108 is shown having width W2 and length equal to L2+L3. Width W2 may be a width as known for a signal trace or line, and/or the like. Similarly, length L2+L3 may be a length known for a signal trace or line, and/or the like. Width W1 may be less than equal to or greater than width W2. Also, length L1 may be a length greater than less than, or equal to width W1. Length L1 and width W1 represent the footprint shape of openings 122, 124, and 126. Thus, those openings have a square footprint shape. However, it can be appreciated that other shapes are considered (e.g., see FIG. 3 and descriptions herein for FIG. 2B). It can also be appreciated that openings in addition to 122, 124, and 126 may be formed along length L1 and/or L3 of trace 108. Similarly, it can be appreciated that trace 108 may have a length, shape, and/or layout different than that shown in FIG. 1A. Thus, forming openings 122, 124, and 126 may change a ground parasitic of trace 108, thus changing or adjusting a signal phase velocity or a flying time of a signal transmission along length L2+L3 of trace 108. Similarly, openings 122, 124, and 126 may change a capacitive and/or inductive phase characteristic of trace 108. Thus, the openings may change or adjust a transmission skew of trace 108 as compared to another trace where trace 108 and the other trace are a differential signal pair, such as to effect a timing compensation of the differential signal pair of traces or lines.

Layer 104 may represent a ground layer of a PCB or electronic device. Similarly, trace 108 may represent a trace or differential signal trace of line of a PCB or electronic device. Layer 106 may represent a dielectric material between trace 108 and layer 104, and layer 102 may represent a dielectric or insulator layer disposed on the opposite side of layer 104 from trace 108 of a PCB or electronic device. Layers 106 and 102 may or may not be the same material. Trace 108 and layer 104 may or may not be the same material.

As described herein, a signal or a trace may describe a high-speed signal or a trace for transmitting a high speed signal. Similarly, a "trace" as described herein may include a single trace that is not a trace of a differential signal pair, a trace of a differential signal pair (e.g., a trace to transmit a signal where the other trace of the pair transmits a signal having an opposite phase with respect to time), or a like trace. Similarly, an electronic device as described herein may include a semiconductor device, an electronic device formed on a substrate, a transistor, a printed circuit board (PCB), a package (e.g., for mounting or packaging a semiconductor device or other electronic device), or another electronic device, which may include a trace or differential signal traces or lines. Also, although descriptions herein pertain to a PCB, the concepts described herein are also applicable to traces or lines of other electronic devices.

Layer or trace 108 is shown having thickness T1, layer 106 having thickness T2, layer 104 having thickness T3, and layer 102 having thickness T4. Thickness T1 may be a thickness appropriate for a trace or signal line, or the like. Similarly, thickness T2 may be a thickness appropriate or selected for an insulator or dielectric layer between a trace and a ground plane layer. Also, thickness T3 may be a thickness appropriate for a ground plane layer. Similarly, thickness T4 may be a thickness appropriate for an insulator layer formed below or under a ground plane layer with respect to a trace (e.g., trace 108). Specifically, these thicknesses may be appropriate for the appropriate trace or layer of a PCB, chip package, or electronic device, and/or the like.

Thickness T1 may be a thickness of 0.1, 0.2, 0.4, 0.8, 1.0, 1.3, 2.0, 4.0, 8.0, any combination thereof, or any range between any thickness or combination thereof of mils in thickness (e.g., 1 mil equals 0.001 inches). Thickness T3 may be a thickness similar to that described above for thickness T1. It is also appreciated that thickness T1 may be a thickness of a trace or line for transmitting a signal on or in a PCB or electronic device, as known in the art. Likewise, thickness T3 may be an appropriate thickness for a ground plane or conductive layer of a PCB or electronic device, as known in the art.

Thickness T2 may be a thickness of at least 0.25, 0.5, 1, 2, 4, 5, 6, 8, 10, 20, any combination thereof, or any range between any thickness or combination thereof of mils. Thickness T4 may be a thickness equal to or greater than that of thickness T2. It is also considered that thickness T2 may be a thickness as known in the art for an insulator or dielectric layer between a trace or line and a conductive ground layer of a PCB or electronic device, as known in the art. Likewise, thickness T4 may be a thickness of an insulator or dielectric layer on the opposite side of a ground plane from a trace, as known in the art. In some cases, thickness T4 will be a thickness similar to thickness T2, or may be a thickness of an insulator or dielectric layer between a ground plane and a trace, such as in a case where a trace exists disposed on, touching, or away from the surface of layer 102 opposite to that of surface 130. For example, openings 132, 134, and 136 may change a ground parasitic of trace 108, as well as changing a ground parasitic of a trace formed touching, on, or under the surface of layer 102 away from or opposed to surface 130.

Distance D1 represents a distance or length between edges or side walls of adjacent openings (e.g., between the sidewall of opening 122 closest to opening 124, and the sidewall of opening 124 closest to opening 122). Distance D1 may be a distance of 1, 2, 4, 5, 8, 10, any combination thereof, or any range between any distance or combination thereof of mil's (e.g., 1 mil equals 0.001 inches).

L1 may be a length of 1, 2, 4, 5, 8, 10, and/or a combination thereof of mil's. W1 may be a distance as described above with respect to L1. Likewise, W2 may be a distance as described above with respect to L1. It is also appreciated that W2 may be less than or greater than a distance described above for L1. L2 and/or L3 may be 10×, 20×, 40×, 80×, 100×, 200×, 400×, 800×, 1,000×, 2,000×, any combination thereof, or any range between any multiple or combination thereof of multiples greater in length than the distance described above for L1.

For example, in one embodiment, L1 may be 5 mils, W1 may be 4 mils, D1 may be 5 mils, and W2 may be 5 mils, and L2 may be one inch. Also, in embodiments, thickness T1 and T3 may be 1.3 mils, and thickness T2 (an optionally T4) may be 6 mils. Specifically, there may be approximately fifty openings along L2. In such an embodiment, it is possible that the flying time of a signal along the trace, or a skew for a differential pair may be adjusted by between 2 and 5 picoseconds. Approximately 50 openings may describe 50+/−5 openings. Moreover, in the example above, a number of openings greater than fifty may be used over a length greater than one inch, such as to reduce a phase velocity or skew by between 10 pico-seconds and 100 pico-seconds.

Specifically, where phase velocity $(V_p)=1/(LC)^{1/2}$, the openings in the ground layer may substantially increase L (e.g., by at least an amount of 1×, 2×, 4×, 8×, 10×, any combination thereof, or any range between any multiple or combination thereof), and may cause substantially no reduction in C (e.g., by reducing by no more than 10%, 20%, 40%, 80%, any combination thereof, or any range between any percent or combination thereof). Thus, although C is decreased, it is decreased by very little as compared to the increase in L (e.g., L is increased by an amount at least 2×, 3×, 4×, 8×, 10×, any combination thereof, or any range between any multiple or combination thereof of multiples greater than the decrease in C). As a result, $V_p$ is reduced by the existence of the openings (e.g., whether or not the openings are filled with insulator material).

As a ground plane, layer 104 may provide a "ground" (GND), reference, and/or "0" voltage reference for the signal trace (e.g., trace 108). Layer 104 may be a ground plane layer of a PCB or electronic device having a length and width or footprint (e.g., an area observed from a top perspective view, such as that shown in FIG. 1A and defined by L4 multiplied by W4) that is much larger than that of the area or footprint of the trace for which the openings formed in the ground plane are under or adjacent to (e.g., trace 108). For example, L4×W4 of layer 104 may be 3×, 4×, 5×, 6×, 10×, 20×, 40×, 80×, 100×, 200×, 400×, 500×, 800×, any combination thereof, or any range between any multiple or combination thereof of multiples greater than the surface area of trace 108 (e.g., approximately W2×(L2−L3)). Specifically, the surface area and thickness of area 104 is chosen, as known in the art, to be sufficient, to provide a ground plane layer for trace 108 and any other traces formed on or within the PCB or electronic device which trace 108 and ground layer 104 are a part of (e.g., such as a PCB or electronic device in which trace 108 is a trace or line of a differential signal pair, and multiple other traces and/or differential signal pair exist on or within the PCB or electronic device, such as striplines and/or micro striplines).

Figure 2A:
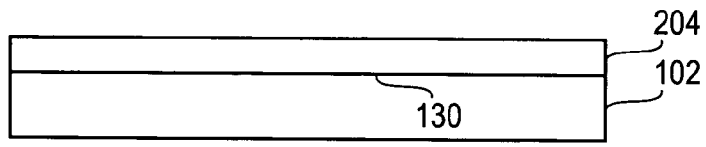
FIG. 2A is a schematic cross-section view of a portion of an electronic device having a conductive layer on an insulator layer.

FIG. 2A is a schematic cross-section view of a portion of an electronic device having a conductive layer on an insulator layer. FIG. 2A may represent part of a device and/or process for forming the device of FIG. 1A, 1B and/or 2G. FIG. 2A shows conductive layer 204 formed on insulator layer 102. Insulator layer 102 may be a dielectric (e.g., having various dielectric constant values), a substrate, or another nonconductive layer. Similarly, layer 102 may be a layer that is neither a conductor nor a semiconductor, but is instead formed of an insulating material and/or dielectric material.

In some cases, layer 102 may be a polymer, natural material, organic material, synthetic material, non-synthetic material, or other insulator material known of a PCB or electronic device. Also, layer 102 may be a dielectric known in the art of forming semiconductor devices, such as silicon dioxide ($SiO_2$), silicon nitride ($SiN_3$) or the like. Layer 102 may be formed by growing or deposition, such as by chemical vapor deposition (CVD), tetraethyl orthosilicate (TEOS) or a similar process. Layer 102 may have a dielectric constant that is less than the dielectric constant on silicon dioxide (e.g., a "low k" material), including polymers as known in the art.

Also, conductive layer 204 may be a layer of conductor material, such as copper (Cu), gold, silver, lead, nickel, cobalt, titanium, tungsten, tantalum, a metal, an oxide thereof, a nitride thereof, and/or an alloy thereof. Layer 204 may be formed by growing (e.g., such as on a seed layer) deposition (e.g., CVD, PVD, ion implantation, and the like), or coating (e.g., electron beam evaporation, crystal growth, sputtering, electrochemical coating, electroplating, physical deposition, and the like. For instance, conductive layer 204 may be formed of a conductive material such as a metal, alloy, or other non-insulator, non-semiconductor material.

Layer 204 may be formed on, touching, and/or in direct contact with layer 102. Alternatively, layer 204 may be formed over layer 204 such as where there are one or more layers between layer 102 and layer 204. Similar definitions may apply to other layers formed on, touching, physically contacting, over, above, other layers as described herein. Specifically, FIG. 2A also shows surface 130, such as a surface of insulator material 102. Surface 130 may be in direct contact or touching a surface of conductive layer 204 (e.g., layer 204 is formed on surface 130 of layer 102), or a layer of adhesive material may be formed between layer 204 and surface 130 of layer 102.

Layer 204 may be formed by plating, such as electrolytic plating of a metal or metal alloy, or by electroless plating of an electroless material onto, on, over, above, overlying, and/or touching layer 102 (e.g., surface 130). Also, it is considered that layer 204 may be formed of a material including one or more of a metal, a copper, a copper alloy, an aluminum, a nickel, a gold, a silver, a platinum, or a palladium material. It is also contemplated that the material of layer 204 may be doped (e.g., such as with catalytic metals), annealed, or radiated with some form of energy to form an alloy. A tin, in indium, a cadmium, a zinc, an aluminum, a bismuth, a ruthenium, a rhodium, a rhenium, a cobalt, or a palladium material. Copper has become a popular choice for conductive layers, such as ground plane layers for various reasons, including to provide low resisitivity, such as a resisitivity that is lower than that of aluminum or aluminum alloys.

Specifically, layer 204 of a material, such as copper, may be introduced by electroplating or physical deposition in a sufficient amount to form thickness T3 of material. In one instance, layer 204 may be formed by electrolytic plating including the deposition of a material (e.g., a metal such as copper) using an external source of electric current. Here, an anode, made form a conductor (e.g., a metal such as copper), serves as a source of conductor (e.g., metal) ions, where the anode is under a different potential voltage than a cathode (e.g., an electroless copper formed over surface 130 during a pre-treatment process, as known in the art). Thus, conductor (e.g., a metal such as copper) on or as part of the anode dissolves from the anode into conductor ions and migrates to the cathode, and becomes deposited on surface 130 (e.g., becomes deposited on the pretreated surface) to form a productive conductive layer (e.g., to form layer 204).

In some cases, an electroplating process for forming layer 204 may involve introducing layer 102 (e.g., a substrate, board, PCB, and/or electronic device including layer 102) into an aquis solution containing metal ions, such as copper sulfate, based solution, and reducing the ions (reducing the oxidation number to a metallic state by applying current between layer 102 and an anode of an electroplating cell in the presence of the solution). Alternatively, layer 204 may be formed by an electroless plating process to form an electroless material layer of an electrically conductive material. Such a process may include the deposition of a conductive material (e.g., a metal such as copper) on a catalytic surface (e.g., such as palladium formed on surface 130) from solution without an external source of current. In some cases, a process for forming electroless material as layer 204 may involve other processes as know in the art.

Moreover, layers 204 and 102 may be assembled together, such as using a laser, heat, pressure, adhesion, stick, and/or "prepreg" process, and/or the like. Specifically, a surface of layer 102 and/or 204 may be treated or have a chemical property such that the layers adhere or attach to each other upon contact or upon additional processing (e.g., pressing, heat treating and/or annealing). Moreover, adhering may include an adhesion layer of material between the two layers being assembled, such as an adhesion material of epoxy, "glue", "prepreg", and/or the like. In some case, layers may be laminated (glued with heat, pressure & sometimes vacuum) together. Thus, descriptions herein of forming layers and/or material on, touching, in direct contact with, above, or over other layers and/or material may include such adhesion processes and/or materials. Subsequently, portions, borders, edges, and/or opening through layer 204 may be etched by one or more standard metal etch processes, laser processes, and/or a drilling processes.

A PCB may have a physical composition including between one and sixteen or more conductive layers separated and supported by layers of insulating material (substrates) laminated (glued with heat, pressure & sometimes vacuum) together. A layer or substrate of PCBs may be made of or include paper impregnated with phenolic resin, such as a composite material made of paper impregnated with a plasticized phenol formaldehyde resin. A substrate or layer may be or include a woven fiberglass mat impregnated with a flame resistant epoxy resin. Also considered are layers and substrates for high power radio frequency (RF) work, which may include or be plastics with low dielectric constant (permittivity) and dissipation factor, such as polyimide, polystyrene and cross-linked polystyrene.

In some cases the layers or PCB may or may not have a conductive core, rigid core materials, flexible core materials (e.g, polyimide film), ceramic and/or metal cores. Usually an electronics engineer designs the circuit, and a layout specialist designs the PCB. The designer must obey numerous PCB layout guidelines to design a PCB that functions correctly, yet is inexpensive to manufacture. The standards organizations publishes design rules intended to ensure manufacturability of PCBs.

Figure 2B:
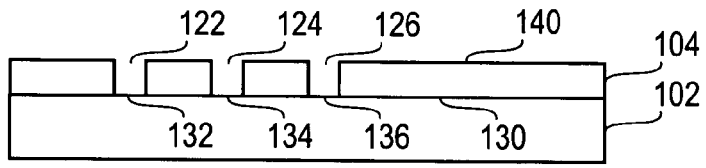
FIG. 2B shows the device of FIG. 2A after forming openings in the conductive layer.

FIG. 2B shows the device of FIG. 2A after forming openings in the conductive layer. FIG. 2B shows conductive layer 104 having openings 122, 124, and 126 to layer 102. For example, opening 122 may extend through layer 104 to surface 130 at portion 132 of the surface. Likewise, opening 124 may extend through layer 104 to portion 134 of surface 130; and opening 126 may extend through layer 104 to portion 136 of surface 130 of layer 102. Hence, insulator material of layer 102 is exposed through holes 122, 124, and 126 at portion 132, 134, and 136 of surface 130.

Openings 122, 124, and/or 126 may have a footprint, profile, or otherwise define a shape with respect to a top perspective view of surface 140 of layer 104. For example, a footprint shape of one or more of those openings may define a circle, a square, a triangle, a rectangle, a polygon, a quadrilateral, an oval, or a combination thereof of shapes in surface 140. The footprint shape may extend through layer 140 to define a similar shape at surface 130. Alternatively, the shape and surface 140 may "fade" or otherwise define a different shape at surface 130 (e.g., such as where etching to form the opening is performed by isotropic an isotropic etching). Specifically, the footprint shape in surface 140 may extend through layer 104 to an opposing surface of layer 104 to expose a similar shape at surface 130 of layer 102.

For instance, openings 122, 124, and 126 may be formed by a process known in the art for forming openings in a material described for layer 204 and/or a material formed as described for layer 204. For example, in cases where layer 204 is a conductive ground layer of a PCB or electronic device, openings 122, 124, 126, and the like may be formed under or adjacent to a trace by etching to form those openings through layer 204 during the same process or set of processes used to etch away other portions of layer 204, such as to form borders around the ground plane, divide the ground plane into portions, or otherwise etch layer 204. It can be appreciated that this allows etching to form the openings to be "free" with respect to processing, such as by allowing the openings to be formed without requiring any additional processing or sets of processes, other than those required already for etching layer 104 to form the PCB or electronic device.

Openings 122, 124, and/or 126 may be formed by drilling, etching, other mechanic processes, other chemical processes, processes known for forming openings in the art of PCB, semiconductor chip, or other electronic device arts. In some cases, the openings may be formed by reactive ion etching (RIE), wet etching (e.g., using a liquid), dry etching (e.g., using one or more gases), or other processes sufficient to form an opening through layer 104. In some cases, the openings may be formed according to known techniques for forming openings in or removing portions of a trace, or conductive layer (e.g., a ground conductive layer) as known in the art of PCB, semiconductor device, and/or electronic device formation. Forming the openings may include, for example, initially using a mask, such as a photoresist mask to define the openings (e.g., the footprint shape), and etching layer 104 with a suitable chemistry. For example, non-plasma etch chemistries may include chlorine ($Cl_2$), hydrochloric acid (HCl), fluorine ($F_2$), bromine ($Br_2$), HBr and/or others. Plasma etches including chemistries of $SF_6$, $NF_3$ or the like. The mask may then be removed (such as by oxygen plasma to remove photoresist). It is contemplated that various masks and/or processes may be used to form the openings.

Forming of the openings may be described as removing a portion of layer 104 to form a hole, shaft, or other footprint shaped opening at least through a portion of thickness T3 of layer 104. Also, it can be appreciated that more or fewer openings than three (e.g., 122, 124, and 126) may be formed in layer 104 (e.g., under trace 108). Also, according to embodiments, layer 102 may be excluded or not exist below layer 104, such as where layer 104 is exposed and material that may be in openings 122, 124, and 126 may or may not extend beyond the bottom of layer 104.

Figure 2C:
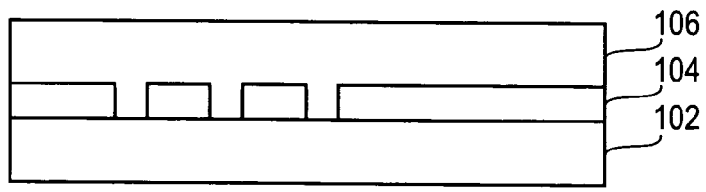
FIG. 2C shows the device of FIG. 2B after forming an insulator material on the conductive layer and through the openings.

FIG. 2C shows the device of FIG. 2B after forming an insulator material on the conductive layer and through the openings. FIG. 2C shows insulator material 106 formed on conductive layer 104 and in openings 122, 124, and 126. It can be appreciated that layer 104 may represent layer 204 after forming openings 122, 124, and 126 through layer 204. For example, insulator material 106 may be a layer of insulator material formed on layer 104, and formed through openings 122, 124, 126, and to surface 130 at portion 132, 134, and 136, respectively. Thus, material 106 may touch or be in direct contact with layer 102 at portion 132, 134, and 136. Alternatively, in some embodiments, material 106 may not be in contact with layer 102 at any or all of portions 132, 134, and 136. For example, material 106 may not extend into openings 122, 124, or 126. Also, material 106 may extend only through a portion of thickness T3 of layer 104, such that it does not contact surface 130 through some or all of the openings. Material 106 may be formed by one or more processes similar to those described above with respect to forming layer 102. Similarly, material 106 may be a material or layer of material as described above with respect to layer 102. The material of insulator material 106 within or through the openings may be described as a plug, column, cylinder, and/or filling of material in the opening. Similar to the description of adhering layer 104 to layer 102, layer 106 may be adhered to layer 104. Thus, the material in the openings may be the adhesive material, stick, glue, epoxy, insulator, dielectric material, or prepreg material, and/or the like.

Figure 2D:
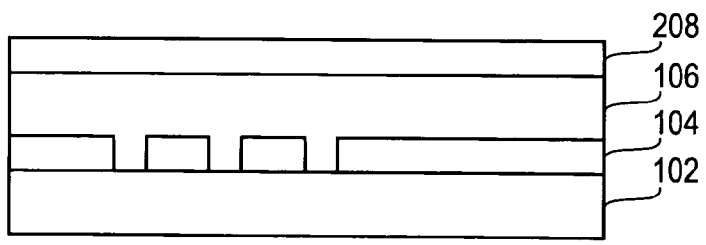
FIG. 2D shows the device of FIG. 2C after forming a conductive material on the insulator material.

FIG. 2D shows the device of FIG. 2C after forming a conductive material on the insulator material. FIG. 2D shows conductive layer 208 formed on, over or touching layer 106. Layer 208 may be formed of a conductor material and/or by a process as described with respect to forming layer 104 on layer 102. Moreover, layer 208 may be adhered to layer 106 as described with respect to adhering layer 104 to layer 102. Layer 208 may be formed of a material known for forming signal traces or lines.

Figure 2E:
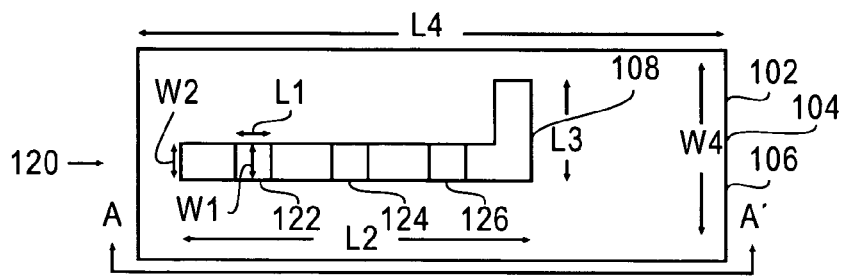
FIG. 2E shows the device of FIG. 2D after removing portions of the conductor material to form a signal trace.
Figure 2F:
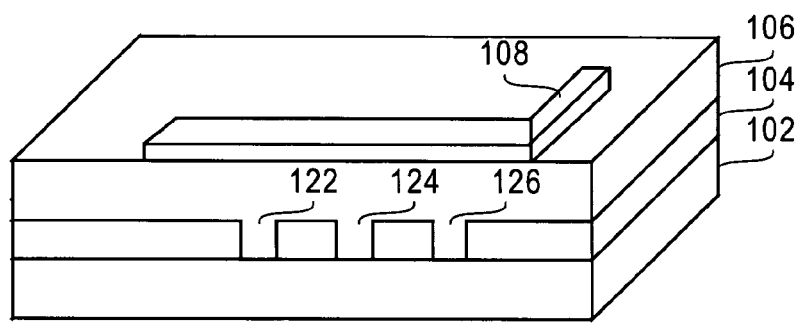
FIG. 2F shows a side perspective view of FIG. 2E.

FIG. 2E shows the device of FIG. 2D after removing portions of the conductor material to form a signal trace. FIG. 2F shows a side perspective view of FIG. 2D. Trace 108 is shown formed on, over or touching layer 106. For example, layer 108 may be formed by removing portions of layer 208 as described above with respect to removing portions of layer 104. However, the portion of layer 108 left remaining may define a signal trace, differential signal trace, pair of differential signal traces, signal line, or trace as known in the art. Moreover, trace 108 may be disposed above, over, and/or adjacent to openings 122, 124, and/or 126. Openings 122, 124, and/or 126, such as a path of openings 120, are each shown under, below, or adjacent to trace 108. Similarly, one or more of the openings may be described as being under, below, or adjacent to trace 108. It can be appreciated that the terms, above, over, under, and/or below are relative and may be switched depending on the orientation or perspective with respect to layer 108 and layer 104. Specifically, portions of layer 108 may be removed to form a trace adjacent, above, or over a path of openings, where the path of openings is defined by openings 122, 124, and 126. It can be appreciated that other openings can be in the path, as long as they are below, under, or adjacent to trace 108. Also, portions of layer 208 may be removed by known techniques by, for example, initially using a mask, such as a photoresist mask to define an area (e.g., a cross-sectional area defining a trace or signal transmission line) for removing portions of layer 208 such that a trace or transmission line is left remaining after etching with a suitable chemistry, such as described for etching layer 104. Thus, it can be appreciated, that layer 108 is layer 208 after removing portions of layer 208.

Figure 2G:
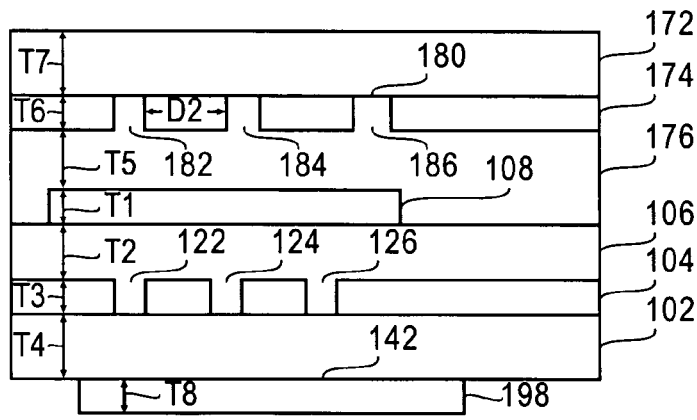
FIG. 2G shows FIG. 2E after forming additional layers on the trace of FIG. 2E.

FIG. 2G shows FIG. 2E after forming additional layers on the trace of FIG. 2E. In some cases, after forming additional layers on trace 108 (e.g., as shown in FIG. 2E) trace 108 may be described as a stripline trace. FIG. 2G shows the structure of FIG. 2E including another ground plane layer having openings on or adjacent to trace 108 and an additional trace on the lower surface of layer 102. Specifically, FIG. 2G shows an embodiment where trace 108 is within or between insulator layers (e.g., such as being a stripline) of a PCB or electronic device. Likewise, trace 198 may be a trace formed on surface 142 of layer 102 where portions of layer 142 are exposed (e.g., portions that are not covered with traces such as trace 198 may be covered with a protective material, but layer 142 is not and inner, mid, or other layer within the PCB or circuit device (e.g., is not a layer such as layer 106). Thus, layer 198 may be a micro strip on the surface of a PCB or electronic device. Trace 198 may have physical dimensions, be formed of a material, and/or be formed by processes similar to those described above with respect to layer 108. The effect of openings 122, 124, and 126 on trace 192 may be similar to those described with respect to the effect of those openings on trace 108.

FIG. 2G shows insulator or dielectric layer 176 formed on, above, or touching trace 108 and layer 106. Similarly, conductive layer 174 is shown formed on, touching, or above layer 176, and insulator layer 172 is shown formed on, above, or touching layer 174. Layers 176, 174, and 172 may be formed of a material and/or by a process similar to that described with respect to forming layers 106, 104, and 102 respectively. Moreover, layer 174 is shown having openings 182, 184, and 186 through layer 174. Openings 182, 184, and 186 may correspond with descriptions for openings 122, 124, and 126, respectively. Specifically, lengths, widths, distances, and thicknesses of layer 176, layer 174, layer 172, opening 182, opening 184, and/or opening 186 may correspond with those described with respect to layer 106, layer 104, layer 102, opening 122, opening 124, and/or opening 126, respectively. For example, thickness T5, T6, and/or T7 may correspond to thickness T2, T3, and T4 of FIG. 1B. Likewise, distance D2 may correspond to distance D1 of FIG. 1B.

It can also be appreciated that the process for forming openings 182, 184, and 186 and/or filling those openings with insulating material may be similar to that described with respect to openings 122, 124, and 126. Thus, it can be appreciated that the effect for change in the ground parasitic, signal phase velocity, flying time of a signal for trace 108 caused by openings 182, 184, and 186 (with or without dielectric material disposed therein) may be similar to the effect described with respect to openings 122, 124, and 126. Specifically, openings 182, 184, and 186 may be above, over, or adjacent to trace 108 (e.g., with respect to a top perspective view. For instance, the geometry, material, formation of, material in, and/or spacing of openings 182, 184, and 186 may be similar to descriptions with respect to openings 122, 124, and 126 (e.g., see FIG. 1A), such as to double the change in ground parasitic and/or signal phase velocity for trace 108.

It is also noted that in addition to thickness T5, layer 176 includes a thickness equal to thickness T1 of layer 108 such that layer 176 touches or is in contact with layer 106. Moreover, similar to the description above for forming layers 102, 104, and 106, layer 176 may be formed on, touching, over, and/or adhered to trace 108 and the surface of layer 106. Similarly, layer 174 may be formed on, touching, over, or adhered to layer 176 and/or layer 172. Finally layer 172, and/or layer 176 may be formed on, touching, or adhered to layer 174, such as where material of layer 172, and/or layer 176 may be formed though openings 182, 184, and 186 so that material of layer 172 contacts material of layer 176 through the openings. Alternatively, the material of layer 172 may not contact the material of layer 176 through the openings. Thus, in some cases, the material of layer 176 is formed on layer 174 and through openings 182, 184, and 186 to (e.g., touching) surface 180 or material 172 similar to the descriptions with respect to forming material 106 through openings 122, 124, and 126 to and touching surface 130 of layer 102.

FIG. 2G shows trace 198 having thickness T8, such as a thickness described above with respect to thickness T1 and/or a thickness of a micro stripline as known in the art. In some cases, thickness T2 may be, thickness T4, and/or thickness T2+T1+T5 may be a thickness of between 2 and 20 mil, of 3× the thickness of T1 (e.g., 2.53, or 3.5× the thickness of a stripline as known in the art), and/or 5× the thickness of thickness T8 (e.g., 4, 4.5, 5, 5.5, or 6 times the thickness of a micro stripline, as known in the art). Thus, in some embodiments, thickness T4 may be approximately 5× thickness T8, and/or thickness T2 may be equal to or approximately equal to 3× thickness T1.

Also, in some cases, trace 198 may have a width (e.g., a top perspective width which would be a width such as shown by width W2 of trace 108, but for trace 198) similar to that described above with respect to width W2. Also, trace 198 may have a width between 3 and 10 mil. It is also considered that trace 198 may have thickness T8 equal to between 1.3 and 2.6 mil, equal to between 1 and 2 mil, and/or equal 1.9 mil. In some cases, the width and thickness of trace 198 (e.g., including those described above) may be that for embodiments where trace 198 is a micro strip. Moreover, trace 198 may have a width, length, thickness, material, and/or formed by a process as known in the art for forming a micro strip.

Likewise, trace 108 may be of a length, width, thickness, material, and/or formed by a process as known in the art for forming a stripline. In some cases, trace 108 will have width W2 similar to that described for a width of trace 198. Also, in some cases, trace 108 may have a thickness as described for thickness T8. Also, trace 198 and/or trace 108, and/or the other trace of a differential pair where trace 198 and/or 108 is one trace of the pair, may have a length of between 0.1 inches and 40 inches. For example, a trace or line as described herein may have a length of 0.1, 0.2, 0.4, 0.8, 1, 2, 4, 8, 10, 20, 40, any combination thereof, or any range between any length or combination thereof of inches in length.

Figure 3:
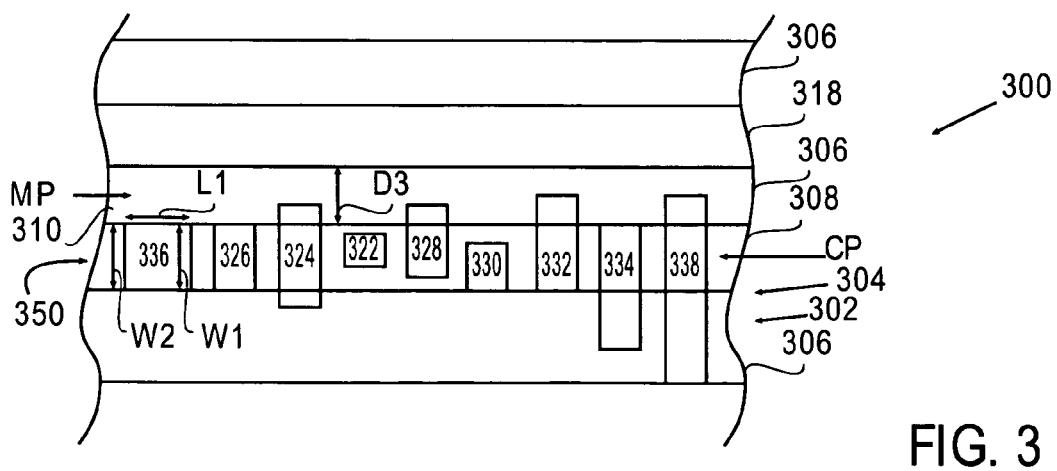
FIG. 3 is a top perspective view of a differential pair of signal traces on a dielectric layer showing openings are formed through a ground plane of one trace.

FIG. 3 is a top perspective view of a differential pair of signal traces on a dielectric layer showing openings are formed through a ground plane of one trace. Any of the openings shown and described for FIG. 3 may be used as an opening or hole as described herein. FIG. 3 shows differential signal pair 300 including trace 308 and 318 formed on, above, or touching insulator layer 306. Specifically, trace 308 and trace 318 may each be one of the traces or lines of a differential signal pair of traces or lines. Layer 306 may be an insulating layer formed on conductive layer 304 (e.g., a ground plane), which is in turn formed on layer 302. Layer 304 is shown having openings 322, 324, 326, 328, 330, 332, 334, 336, and 338 which may correspond to opening 122 in length, thickness, depth, width, formation of process, and/or material disposed therein or there through, with the exception of the length and width of those openings. In addition, the length, width, thickness, material, and process of layers 308, 306, 304, and 302 may correspond to that described above with respect to layer 108, 106, 104, and 102, respectively. Also, the length, width, thickness, material and process of forming trace 318 may correspond to that for forming 108. Alternatively, the above noted geometry, material and processes for forming trace 308 and/or 318 may correspond to that of trace 186 (e.g., such as where pair 300 are micro strips.

FIG. 3 also shows surface 310 of layer 306 between trace 308 and 318. Surface 310 includes midpoint line MP and distance D3 between trace 308 and 318 where MP represent a midpoint of distance D3 between the inner edges or edges of trace 308 and 318 disposed towards each other. Trace 308 is shown having width W2 and opening 336 is shown having length L1 and width W1, such as where trace 308 and opening 336 correspond to trace 108 and opening 122 of FIG. 1A, respectively. However, the other traces are shown having various other lengths and widths with respect to width W2.

The width of an opening may be centered with respect to a centerline CP of trace 308 (e.g., see opening 322) or may be offset with respect to line CP (e.g., see opening 328).

Also, the spacing between the openings may be the same or different. For example, FIG. 3 shows opening 322 centered at a midpoint between opening 324 and opening 328. However, opening 330 is not at a midpoint between opening 328 and opening 332, but is centered at a point closer to opening 328 than to opening 332. It is considered that openings may be equally centered between other openings, centered closer to some openings than others, or a combination thereof for a path of openings (e.g., such as path 120). It is also considered that openings having various widths and lengths, or having the same width and length, may be used in a path. For example, path 350 includes various shaped, and centered openings with respect to line CP and each other. Moreover, path 350 includes openings having various widths with respect to width W2 of trace 308. Thus, a path of openings may include openings having the same center point with respect to line CP, with respect to each other, having the same width with respect to each other, having the same length with respect to each other, or having one, any, or all of these different with respect to each other. For example, a proportion of width to length for an opening may be 1×1, 1×1.5, 1×2, 1×2.5, 1×3, 1×4, 2×2, 2×1, 3×3, 3×2, 2×3, 4×4, 4×3, 3×4, 4×2, 2×4, and the like with respect to each other. In addition, those dimensions may provide minimum or maximum opening areas, such as with respect to a top perspective view as shown in FIG. 3.

According to embodiments, an opening may extend beyond the edges or be wider than width W2 of trace 308, such as shown by openings 124, 128, 133, 134, and 138. In some cases, the opening may extend to the centerline MP, but not beyond that line, between the trace the opening is under or "adjacent to" and the other trace of the differential pair. Specifically, all of the traces shown in FIG. 2D-2G may be described as being "adjacent to" trace 308, as none of them extends beyond line MP in the direction of trace 318 (e.g., none of them extends beyond trace 308 more than one-half distance D3). In addition to being adjacent to trace 308, opening 336, 326, 322, and 320 may be described as being completely under trace 308. Likewise, openings 324, 328, 332, 334, and 338 may be described as having a portion of those openings under trace 308. It can be appreciated that although openings 334 and 338 are shown extending away from trace 318 a distance greater than distance D3, they are still adjacent to trace 308 and do not extend past line MP towards trace 318. Thus, those openings change the ground parasitic of trace 308 more than that of trace 318, thus changing the signal phase velocity, flying time, or harmonic signal time propagation of trace 308. Specifically, any of those traces may change the skew of pair 300 by slowing the transmission of a signal along trace 308 as compared to the transmission of its differential signal along trace 318. Thus, any or all of the openings shown in FIG. 3 may compensate for the situation where trace 308 is shorter in length than trace 318, but otherwise made of a material and has a width and thickness similar to that of trace 318 to reduce a skew due to the difference in length by causing a first part of a differential signal transmitted on trace 308 to travel slower as compared to a second part of a differential signal transmitted on trace 318.

Distance D3 may be a distance of 1, 2, 4, 8, 10, 20, 40, 80, any combination thereof, or any range between any distance or combination thereof of mils in distance. In some cases, distance D3 may be 3× thickness T4, T2, T1+T2, T1+T2+T5, or another thickness of a dielectric layer of a printed circuit board or electronic device between a ground layer and a trace or another ground layer of the PCB or device. In some case, distance D3 may be a distance of between 6 and 18 mil. Finally, distance D3 may be a distance between traces, and/or differential lines of a PCB or electronic device.

Figure 4A:
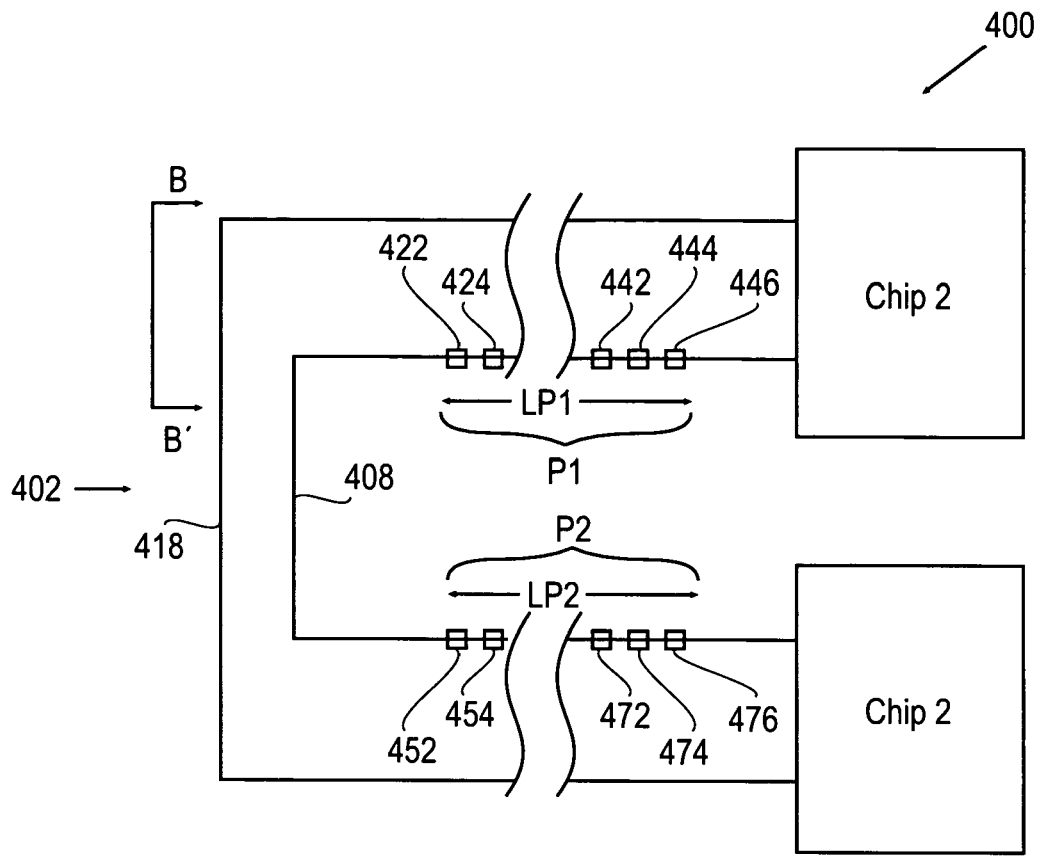
FIG. 4A is a top perspective view of a pair of differential signals to transmit signals between two semiconductor chips.

It is also considered that the footprint size (e.g., length times width, surface area, or area shape from a top perspective view as shown in FIG. 3) of one or more of the openings may be selected or designed to compensate, reduce, or remove a skew and signal phase velocity (e.g., a timing compensation) due to a longer length of trace 318 as compared to trace 308. Also, each trace shown in FIG. 3 may be described as being "closer to" trace 308 then it is to trace 318 since none of the openings cross line MP. Although not shown, it is considered that some embodiments may include openings that actually extend across line MP, but that are closer to trace 308 by having most of their footprint area closer to trace 308 than to trace 318 with respect to line MP. In fact, in some embodiments, no portion of an opening may be directly under trace 308, however, a majority of the footprint of the opening may be closer to trace 308 than to trace 318. In some embodiments, openings may be selected or designed to have a sufficient number of openings having a sufficient footprint size to be formed through a conductive layer (e.g., a ground plane) to slow transmission of a first portion of a differential signal on a trace (e.g., trace 308) to substantially eliminate a skew. FIG. 4A and/or 4B below, may or may not provide such an embodiment.

Figure 4B:
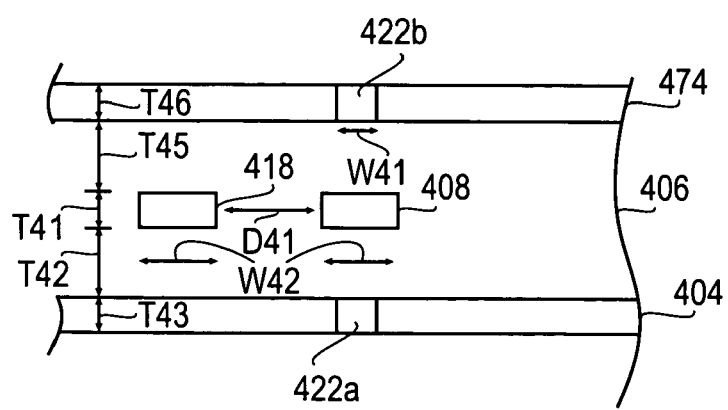
FIG. 4B is an example of a schematic cross-section view through line B-B' of FIG. 4A.

FIG. 4A is a top perspective view of a pair of differential signals to transmit signals between two semiconductor chips. FIG. 4A shows electronic device 400 including two chips connected by traces or lines of differential signal pair 402. Specifically, pair 402 includes trace 408 and trace 418. For example, pair 402 may connect electronic circuitry of chip 1 and chip 2 by being a differential pair of micro strips or striplines to carry the two parts of a differential signal from chip 1 to and from chip 2. Electronic device 400 may represent a printed circuit board having chip 1 and chip 2 mounted on that PCB. Pair 402 may be electronically connected or attached to contacts, wires, traces, or other electrical connection points of chip 1 and chip 2, such as known in the art. Also, FIG. 4B is an example of a schematic cross-section view through line B-B' of FIG. 4A. FIG. 4B shows trace 418 and 408 within insulator layer 406 and having conductive layers 404 and 474 (e.g., ground planes or ground conductor planes) above and below traces 408 and 418.

Specifically, FIGS. 4A and 4B will now be described with respect to embodiments where traces 408 and 418 are striplines, layer 406 is a dielectric layer, and layers 404 and 474 are ground plane layers having corresponding openings 422a and 422b (openings 422a and 422b representing opening 422 of FIG. 4A) below and above trace 408, respectively. The length of trace 408 is shorter than that of trace 418. Thus, in order to slow down a part of a differential signal transmitted on trace 408, trace 408 includes path of openings P1 and P2 each including openings over, under, adjacent to, along, and/or closer to trace 408 than to trace 418. For example, opening 422, 424 . . . , 442, 444, and 446 of path P1 are shown along length LP1. As shown in the break in the traces, openings and lengths of path P1 may include additional openings and/or lengths. The openings of path P1 may have similar and/or different lengths, widths, center points, footprints, etc., as described herein. Similarly, path P2 is shown including openings 452, 454 . . . , 472, 474, and 476; and having length LP2. Openings and lengths of path P2 may or may not correspond to those with respect to path P1.

Thus, paths P1 and/or path P2 may correct for the difference in length between shorter trace 408 and longer trace 418 by slowing the signal phase velocity or flying time of a signal transmission on trace 408 with respect to that of the signal phase velocity or flying time of a signal transmitted on trace 418 to completely or substantially correct for the skew of a differential signal transmitted on trace 408 and 418 between chip 1 and chip 2. In some cases, path P1 and/or path P2 may include between 6 and 6,000 openings each, such as where a path includes 6, 7, 8, 9, 10, 20, 40, 80, 100, 200, 400, 800, 1000, 2000, 4000, 6000, any combination thereof, or any range between any number or combination thereof of numbers of openings that may or may not be filed with insulator material, as described herein.

According to embodiments, the length of trace 408 may be 30 mil shorter then that of the trace 418 leading to a skew of about 5 pico-seconds (e.g., without the openings of path P1 and P2, the same signal transmitted by chip 1 on traces 408 and 418 would arrive at chip 2 about 5 pico-seconds earlier from path 408 then path 418). In order to compensate for the skew, paths P1 and P2 may each have a length (LP1 and LP2) equal to 0.5 inches and have a number of openings (e.g., opening 422 through 446, and 452 through 476) of 50 openings. Thus a total length of one inch having 100 openings filled with insulator material through those openings in a ground plane below traces 408 and 418 is provided. Specifically, as shown in FIG. 4B, thicknesses T46, T45, T41, T42, and T43 may be 1.3 mil, 6 mil, 1.3 mil, 6 mil, and 1.3 mil, respectively. Moreover, widths W41 and W42 may be 4 mil and 5 mil, respectively; and distance D41 may be 5 mil. Thus, as shown in FIG. 4B, where opening 422a and 422b represent each of the 50 openings along path P1 and each of the additional 50 openings along path P2, a skew compensation of 5 pico-seconds between traces 408 and 418 may be compensated for, such as without adding length to or otherwise redesigning or relaying out trace 408, or trace 418 (e.g., without changing the length or layout of either trace after an initial design but instead by forming the openings in path P1 and P2 during manufacturing). The geometries and dimensions above are examples, as other geometries, dimensions, thicknesses, widths, lengths, numbers of openings, and the like are considered for compensating the skew (e.g., to correct for the difference in length between the traces).

For example, traces 418 and 408 may represent D+ and D− signal traces, respectively, of a micro stripline differential pair. Holes on ground have been cut adjacent to D− so that from transmission line point of view, L and C will be different for D+ and D−. Therefore, signals of D+ and D− will propagate at different phase velocities. So if there is skew or timing difference between D+ and D− originally (e.g., the difference due to the length of trace 408 being shorter than trace 418), then after propagation through this transmission line section, the skew or timing difference can be compensated. According to embodiments, there can be different geometries or patterns for hole distribution on the ground plane(s) to achieve optimized performance in skew/timing compensation.

This same principle or concept also applies to stripline differential pair. Specifically, if traces 408 and 418 are a stripline differential pair, holes may be cut in the ground plane below trace 408 to compensate for the skew (since there is not ground plane above the traces). It can be appreciated that in such an example, the number of holes in the single plan will have to include all of the holes from both planes of FIGS. 4A and 4B (e.g., 200 holes below or adjacent to trace 408 in plane 404 provides the same compensation as described above for both planes of FIGS. 4A and 4B).

The concepts described herein may be used to slow the signal transmission speed or phase velocity of transmission along the shorter length trace of a pair of differential signal traces or line, by forming openings through a ground conductive layer below, above, or adjacent to the shorter length trace. Specifically, those openings may be closer to the shorter length trace then to the longer length trace, thus changing the ground parasitic and reducing the signal transmission speed or velocity for a signal along the shorter trace, such that the opposing phases or polarities of differential signals along the differential signal pair transmitted from a transmission or start location of the pair arrive at an end or receive location of the pair at the same time, or substantially at the same time. Substantially at the same time may be defined as within 1, 2, 4, 8, 10, any combination thereof, or any range between any number or combination thereof of pico-seconds. The concepts herein may be used to adjust a skew of a differential pair that is equal to or greater than 10, 20, 40, 80, 100, 200, any combination thereof, or any range between any number or combination thereof of pico-seconds. As known, the magnitude of the skew is often proportional to the distance or difference in distance of length of differential signal pairs. Concepts herein may be used to substantially eliminate such a skew by reducing it to within 1, 2, 4, 8, 10, any combination thereof, or any range between any number or combination thereof of pico-seconds. Concepts herein may be used to correct a skew to reduce or remove common mode between the differential signal line pair, such as to the extent necessary to allow a receiver to decode the signal (e.g., signals on the pair) received.

Accordingly, it is possible to change the phase velocity of a trace by forming openings in a ground plane adjacent to, disposed above, and/or disposed below the trace and filling the openings with an insulator or dielectric to adjust a ground parasitic of the trace. Thus, the phase velocity of a trace can be changed without adjusting the length, width, thickness, and/or material of the trace. Moreover, this also allows adjusting a skew compensation of a differential signal pair without changing the length, width, thickness, material, and/or routing of either of the traces of the differential pair. It can be appreciated that a benefit realized includes adjusting a phase velocity of a trace after the design, selection, and/or testing of the phase velocity and/or a time to send a signal having one or more frequencies from one location on the trace to another location on the trace without changing a layout or routing of the trace (e.g., such as on a PCB or electronic device). In some cases, pairs of differential signal traces may be designed, such as for a layout on or within a PCB or electronic device. The transmission of signals on the differential pairs may be tested on a computer or on a prototype of the PCB or electronic device. Then, undesirable or skew of pairs of traces may be corrected without changing the design or selection of the layout by forming openings in one or more ground conductive layers of the PCB or electronic device above and/or under one or both of the traces of each differential pair. Thus, it is possible to form or manufacture PCBs or electronic devices according to the design or selection of layouts without redesigning or creating a second layout of differential pairs having a skew adjusted by forming openings in the ground conductive layers. Benefits of this capability are an easier, economical, and efficient way to adjust the skew of differential signal pairs or of single traces (e.g., traces that are not differential signal pairs) without redesigning or selecting a different layout or routing of any of the traces of the PCB or electronic device.

The invention is not limited to the specific embodiments described above. For example, concepts described herein may be applicable to any signal transmission line or medium where transmission speed is affected by ground parasitic changes, a geometry of (e.g., openings in) a ground plane or grounded medium under, over or adjacent to the transmission line or medium. Accordingly, other embodiments are within the scope of the claims.

What is claimed is:

1. A method of forming a printed circuit board (PCB) comprising:

forming a first layer of conductive material on a first layer of insulator material;

forming a plurality of openings through the first conductive layer and to the first insulator layer along a path;

forming a second layer of insulator material on the first layer of conductive material and through the openings and to the first layer of insulator material;

forming a second layer of conductive material on the second layer of insulator material;

removing portions of the second conductive layer to form a signal trace over the path; and designing a plurality of pairs of differential signal traces of the PCB;

correcting the skew of each pair by forming openings in a ground conductive layer of the PCB under a first trace of each pair.

2. The method of claim 1 wherein forming the second layer of insulator material comprises adhering the second layer of insulator material on to the first layer of conductive material and through the openings to the first layer of insulator material.

3. The method of claim 1 further comprising:

forming a prototype PCB;

testing a skew of each pair;

forming a plurality of PCBs having the corrected skew.

4. The method of claim 1 wherein the first layer of conductive material is a ground layer and the second layer of insulator material touches the first layer of insulator material through the openings.

5. The method of claim 1 wherein the first conductive layer comprises a first metal or alloy and forming a plurality of openings comprises etching the plurality of openings through the first metal or alloy, and wherein the second conductive layer comprises a second metal or alloy and removing portions of the second conductive layer comprises etching the second metal or alloy.

* * * * *